United States Patent
Tay et al.

(10) Patent No.: US 9,279,946 B2
(45) Date of Patent: Mar. 8, 2016

(54) PREMOLDED CAVITY FOR OPTOELECTRONIC DEVICE

(75) Inventors: Gary Tay, Singapore (SG); Dominique Ho, Singapore (SG)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 337 days.

(21) Appl. No.: 13/479,103

(22) Filed: May 23, 2012

(65) Prior Publication Data

US 2013/0315533 A1    Nov. 28, 2013

(51) Int. Cl.

| G02B 6/12 | (2006.01) |
| H01L 31/16 | (2006.01) |
| G02B 27/00 | (2006.01) |
| G02B 6/42 | (2006.01) |
| G02B 6/138 | (2006.01) |
| H04B 10/80 | (2013.01) |
| H01S 5/022 | (2006.01) |
| H01L 25/16 | (2006.01) |

(52) U.S. Cl.
CPC ............... *G02B 6/4201* (2013.01); *G02B 6/12* (2013.01); *G02B 6/138* (2013.01); *G02B 6/4279* (2013.01); *H01L 25/167* (2013.01); *H01L 31/16* (2013.01); *H01S 5/02208* (2013.01); *H04B 10/802* (2013.01); *G02B 6/4204* (2013.01); *H01L 2224/48091* (2013.01); *H01L 2224/48247* (2013.01); *H01L 2224/48257* (2013.01)

(58) Field of Classification Search
CPC ............... H01L 25/167; H01L 31/16; H01L 2224/48091; H01L 2224/48257; H01L 2224/48247; H01L 2924/00014; H01L 2224/00014; H01L 33/52; H01L 33/54; H01L 33/56; G02B 6/42; G02B 6/4279; G02B 6/12; G02B 6/13; G02B 6/138; G02B 6/4201; G02B 6/4204; H01S 5/02208; H04B 10/801; H04B 10/802
USPC .......... 385/14, 31, 39, 88–92; 257/81, 82, 99, 257/E33.077, 91, 98, E33.058, E33.066, 257/E33.067; 250/239, 551; 264/1.1, 1.24
See application file for complete search history.

(56) References Cited

U.S. PATENT DOCUMENTS

| 4,980,568 A * | 12/1990 | Merrick et al. ................ 250/551 |
| 5,340,993 A * | 8/1994 | Salina et al. ................... 250/551 |
| 5,545,893 A * | 8/1996 | Brown et al. .................. 250/239 |
| 6,627,872 B1 * | 9/2003 | FuKamura et al. ........... 250/239 |
| 8,022,137 B2 | 9/2011 | Taguchi et al. |
| 8,412,006 B2 * | 4/2013 | Tay .......................... G02B 6/43 385/14 |
| 2007/0029569 A1 * | 2/2007 | Andrews .......................... 257/99 |
| 2007/0280624 A1 * | 12/2007 | Negley et al. ................. 385/146 |
| 2011/0269918 A1 | 11/2011 | Hamamoto et al. |
| 2011/0309407 A1 | 12/2011 | Hamamoto et al. |

OTHER PUBLICATIONS

Khan, Jamshed N., "Using Hermetic Optocouplers in Military and Space Electronics", Avago Technologies, Mar. 17, 2010, 24 pages.
Svrcek, Dan, "Potential Manufacturers for Hi-Rel Solid-State Relays", Wyle Laboratories, Dec. 2004, 24 pages.

\* cited by examiner

*Primary Examiner* — Akm Enayet Ullah
*Assistant Examiner* — Michael Mooney

(57) ABSTRACT

An optoelectronic device is disclosed. The optoelectronic device may be employed as a single or multi-channel opto-coupler that electrically isolates one circuit from another circuit. The opto-coupler may include one or more premolded cavities with a light-coupling medium contained therein. Walls of the one or more premolded cavities advantageously help shape the light-coupling medium during manufacture, therefore, resulting in a light path with controlled shape and dimensions.

20 Claims, 9 Drawing Sheets

PREMOLDED CAVITY FOR OPTOELECTRONIC DEVICE

FIELD OF THE DISCLOSURE

The present disclosure is generally directed toward optoelectronic devices and, in particular, opto-coupling devices.

BACKGROUND

In electronics, an opto-coupler, also referred to as an opto-isolator, photocoupler, or optical isolator, is an optoelectronic device designed to transfer electrical signals by utilizing light waves to provide coupling with electrical isolation between its input and output. One goal of an opto-coupler is to prevent high voltages or rapidly changing voltages on one side of the circuit from damaging components or distorting transmissions on the other side.

A typical opto-coupler includes a light source, such as a Light Emitting Diode (LED), a photodetector, and an insulation medium. As the name suggests, an optical path needs to be created between the LED and photodetector via the insulation medium. This is traditionally done by using an optically-transparent material such as silicone to create the light path. The insulation medium not only acts to allow the transmission of light from the LED to the photodetector, but the insulation medium also electrically insulates the input and output sides of the circuit.

One drawback to working with currently-available transparent and electrically-insulating materials such as silicone is that when applied to the opto-coupler, the silicone is in a "liquid" state and, therefore, does not has a definite shape. Accordingly, the silicone will normally take a shape due to its inherent surface tension. Using the surface tension of the silicone to shape the insulation medium is difficult and inconsistent. This characteristic can create an issue with light coupling because the shape, density, and other characteristics of the silicone and, therefore, the optical path, will vary from one opto-coupler to the next.

BRIEF DESCRIPTION OF THE DRAWINGS

The present disclosure is described in conjunction with the appended figures.

DETAILED DESCRIPTION

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

As can be seen in FIGS. 1-8, various configurations of optoelectronic devices and intermediate optoelectronic devices are depicted. One or more of the optoelectronic devices may be employed as opto-couplers or as components within a coupling system. In some embodiments, the optoelectronic devices may be incorporated into any system which requires current and/or voltage monitoring, but is susceptible to transients. In some embodiments, the coupling system in which the optoelectronic devices described herein is rated to operate at about 5 kV, 10 kV, or more. Stated another way, the input side (e.g., a high-voltage side) of the optoelectronic device may be directly connected to a 5 kV or 10 kV source without damaging the optoelectronic device or any electronic devices attached to the output side (e.g., a low-voltage side) of the optoelectronic device. Accordingly, the coupling system which employs the optoelectronic devices disclosed herein may be configured to operate in high-voltage or high-current systems but may also be configured to separate the high-voltage or high-current systems from a low-voltage or low-current system.

Figure 1:
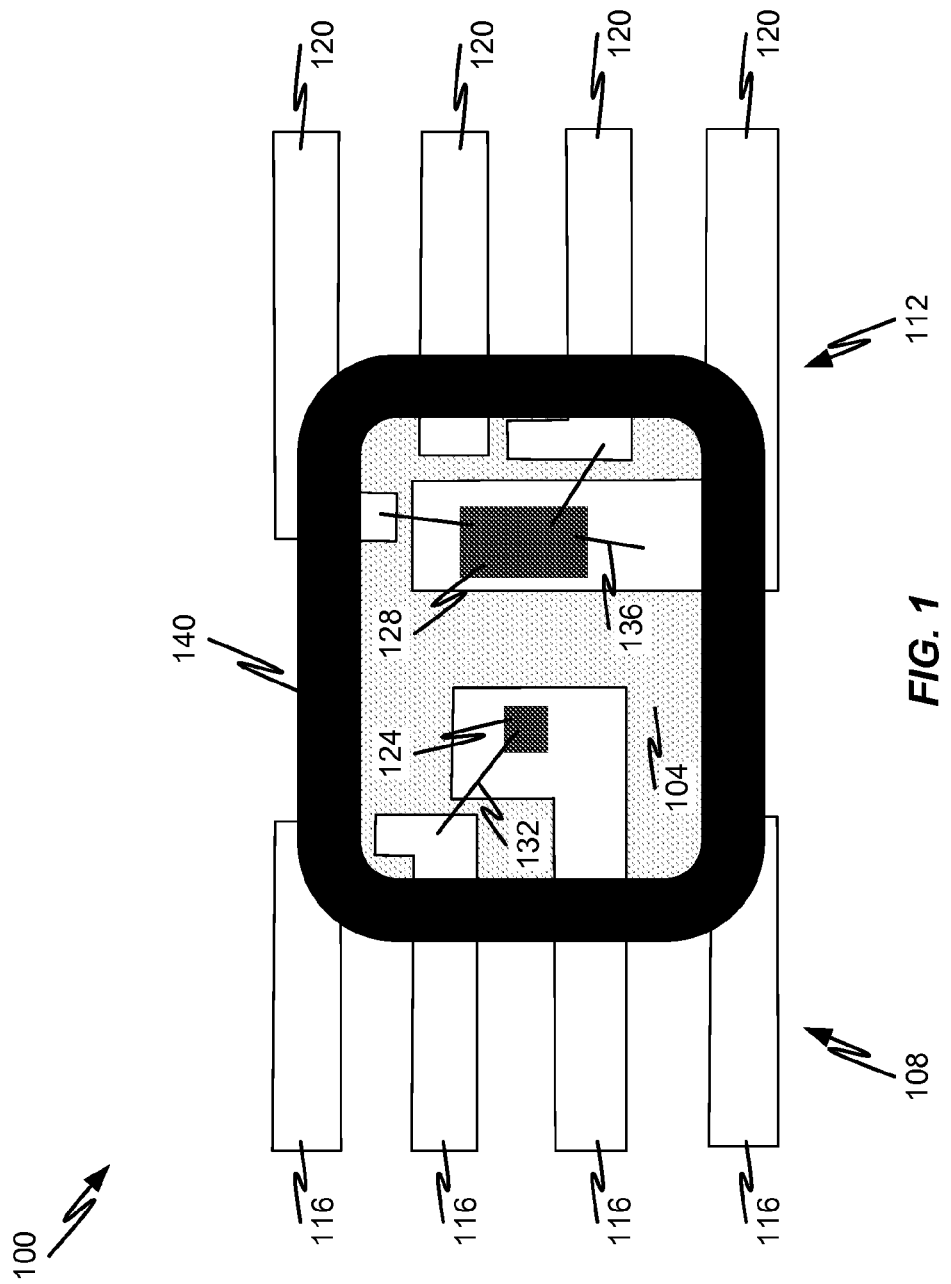
FIG. 1 is top view of a first optoelectronic device in accordance with embodiments of the present disclosure.

Referring initially to FIG. 1, a first optoelectronic device 100 is depicted in accordance with embodiments of the present disclosure. The first optoelectronic device 100 may comprise a substrate or base layer 104 that supports one or more components of an input side 108 and one or more components of an output side 112. Both the input side 108 and output side 112 may comprise one or more leads 116, 120, respectively, that are configured to connect to an input circuit and an output circuit.

The leads 116, 120 may be integrated into the substrate 104 (e.g., as traces, wires, or the like) or they may be separate components that have been attached to the substrate 104. The substrate 104 is generally made of a non-conductive or insulating material whereas the leads 116, 120 are conductive. Both sets of leads 116, 120 may be constructed of similar or identical materials. Specifically, the input side 108 and output side 112 and the features of each may be manufactured from a single sheet of metal that is stamped, etched, cut, folded, bent, welded, etc. and then integrated into the substrate 104. Alternatively, the substrate 104 may correspond to a Printed Circuit Board (PCB) with one or more traces, contact pads, vias, thru holes, etc. established thereon. Where the substrate 104 corresponds to a PCB, the PCB may either be rigid or flexible.

As some non-limiting examples, the leads 116, 120 may be constructed of metal (e.g. copper, silver, gold, aluminum, etc.), graphite, and/or conductive polymers. It may also be possible that the leads 116 of the input side 108 and leads 120 of the output side 112 are constructed from different materials. The leads 116, 120 may extend to other contact pads on the PCB or they may be configured to be formed as pins to be inserted into a PCB (e.g., the optoelectronic device 100 may comprise an electrical component that is insertable into a PCB, motherboard, daughterboard, or the like).

Although embodiments of the present disclosure do not show the leads 116, 120 as having a specific configuration, it should be appreciated that the leads 116, 120 may comprise any type of known, standardized, or yet-to-be developed configuration such as straight-cut leads, J leads, SOJ leads, gullwing, reverse gullwing, etc.

The optoelectronic device 100 may be provided to couple the input circuit to the output circuit while maintaining an electrical isolation between the input circuit and output circuit. Specifically, electrical isolation between the input side 108 and output side 112 may be achieved by maintaining an electrically-insulating gap between the leads 116 of the input side 108 and the leads 120 of the output side 112. The gap between the input side 108 and the output side 112 may be filled with air, gas, liquid, plastic, or any other medium which substantially prevents or inhibits electrical current from passing directly from the input side 108 to the output side 112. In other words, the input side 108 is electrically isolated from the output side 112. The input side 108 may be connected to a circuit whose current and/or voltage is being measured and the output side 112 may be connected to measurement and/or control circuitry.

Electrical signals may be transmitted from the input side 108 to the output side 112 via light or light coupling. In some embodiments, the input side 108 may comprise a light source 124 and the output side 112 may comprise a light detector or photodetector 128. The light source 124 may be a single light source or a plurality of light sources. Likewise, the light detector 128 may be a single detector component or multiple detector components.

In some embodiments, the light source 124 corresponds to a surface mount LED, a traditional LED (e.g., with pins for thru-hole mounting), an array of LEDs, a laser diode, or combinations thereof. The light source 124 is configured to convert electrical signals (e.g., current and/or voltage) from one or more of the leads 116 into light. The light emitted by the light source 124 may be of any wavelength (e.g., either in or out of the visible light spectrum).

In some embodiments, the light detector 128 corresponds to device or collection of devices configured to convert light or other electromagnetic energy into an electrical signal (e.g., current and/or voltage). Examples of a suitable light detector 128 include, without limitation, a photodiode, a photoresistor, a photovoltaic cell, a phototransistor, or combinations thereof. Similar to the light source 124, the light detector 128 may be configured for surface mouning, thru-hole mounting, or the like.

As can be seen in FIG. 1, the light source 124 may be physically mounted on one lead 116 and electrically connected to another lead via one or more wires 132. In some embodiments, one surface of the light source 124 is an anode and another surface of the light source 124 is a cathode. One of the anode and cathode may be electrically connected to one of the leads 116 and the other of the anode and cathode may be electrically connected to a different one of the leads 116. By creating a potential between the anode and cathode of the light source 124, the light source 124 may be configured to emit light of a predetermined wavelength. It should be appreciated that not every lead 116 needs to be connected either physically or electrically with the light source 124.

Like the light source 124, the light detector 128 may be mounted on one of the leads 120 of the output side 112 and may be electrically connected to one or more leads 120 of the output side 112. In some embodiments, one or more wires 136 are used to electrically connect the light detector 128 to the leads 120. In an opposite fashion to the light source 124, the light detector 128 may convert light energy transmitted by the light source 124 and detected at a light-detecting surface of the light detector 128 into electrical signals that are transmitted via one or more of the wires 136. The electrical signals transmitted by the light detector 128 may be carried to the output circuit via the leads 120. Also like the light source 124, it is not required that every lead 120 be electrically or physically connected to the light detector 128, although such a configuration is possible.

The optoelectronic device 100 may further comprise a retaining feature 140 that is established on the substrate 104. The retaining feature 140 may be an integral part of the substrate 104, molded to the substrate 104, or separately manufactured and then attached to the substrate 104 is a secondary manufacturing process. In some embodiments, the substrate 104 comprises a polymer or insulating material and the retaining feature 140 also comprises a polymer or insulating material. Where the substrate 104 and retaining feature 140 are integrated, the substrate 104 and retaining feature 140 may be made of the same materials. It may also be possible to have the retaining feature 140 be made of a material that is different from the material of the substrate 104. In some embodiments, the substrate 104 is premolded with the retaining feature 140 thereon. Suitable materials that may be used to mold the retaining feature 140 include, without limitation, plastics or polymers such as polyphthalamide (PPA), polyamide, silicone, epoxy, epoxy molding compound, Liquid Crystal Polymer, FR-4, any other insulating material, or combinations thereof. The non-conductive portions of the substrate 104 may be made of similar or identical materials.

The retaining feature 140 may be established to enclose the areas where the light source 124 and light detector 128 are to be mounted as well as the areas where the wires 132, 136 are to extend. As will be discussed in further detail herein, the retaining feature 140 may provide many advantages over traditional optoelectronic device and opto-couplers not exhibiting a retaining feature 140. In particular, the retaining feature 140 may be configured to help confine and shape the material used to establish the optical path between the light source 124 and light detector 128. The retaining feature 140 may also be configured to help reflect light that is transmitted by the light source 124 toward the light detector 128, thereby alleviating the need to employ a highly-sensitive and potentially expensive light detector 128.

Figure 2:
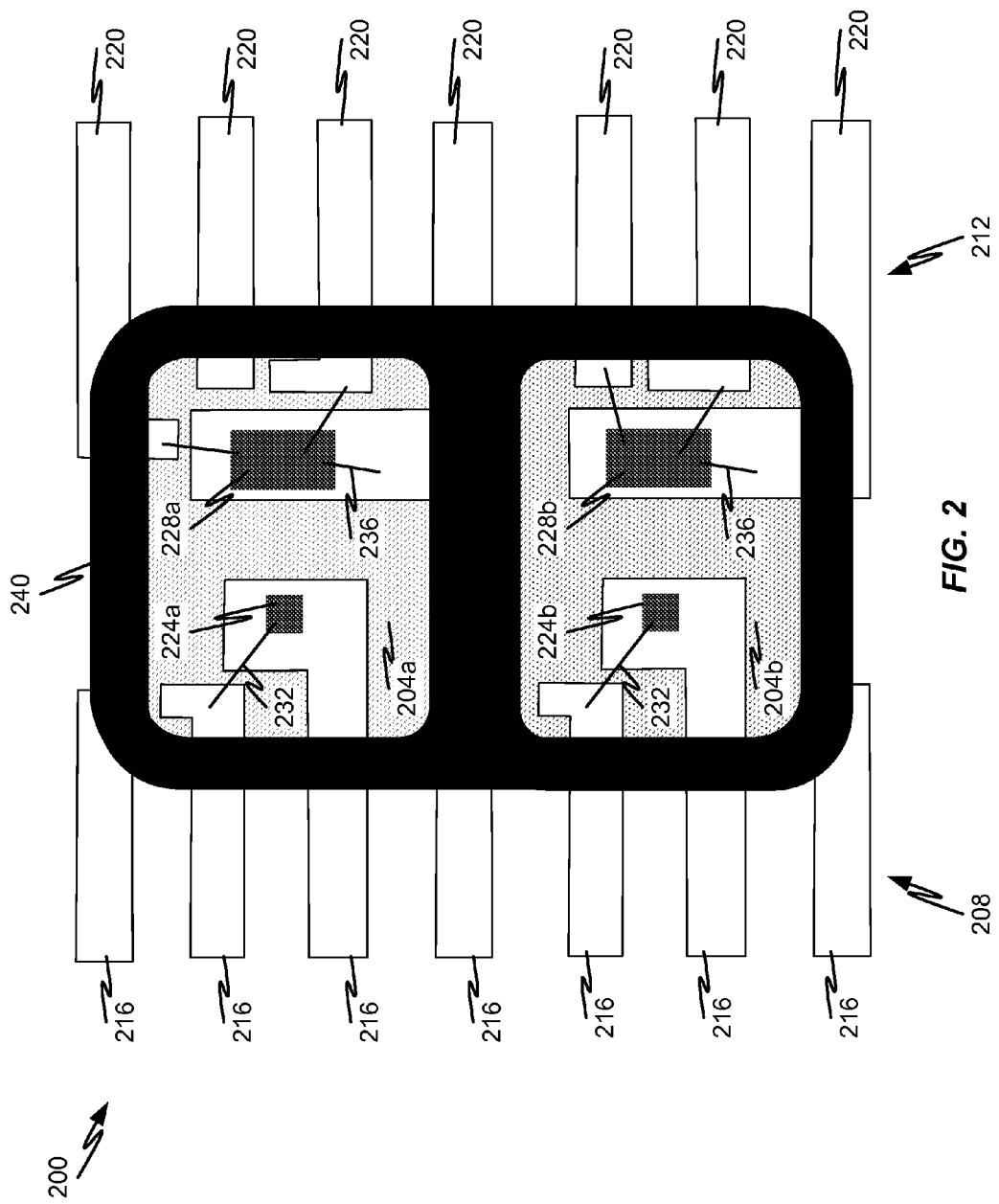
FIG. 2 is a top view of a second optoelectronic device in accordance with embodiments of the present disclosure.

Referring now to FIG. 2, a second optoelectronic device 200 will be described in accordance with embodiments of the present disclosure. The second optoelectronic device 200 may comprise many features that are similar or identical to the first optoelectronic device 100 except that the second optoelectronic device 200 is configured as a multi-channel optoelectronic device or multi-channel opto-coupler. In some embodiments, the second optoelectronic device 200 comprises a substrate having a first portion 204a and second portion 204b. Each portion of the substrate may support different sets of optical components (e.g., different channels). Similar to the first optoelectronic device 100, the second optoelectronic device 200 may comprise an input side 208 and output side 212, each having one or more leads 216, 220, respectively.

Each portion of the second optoelectronic device 200 may be substantially similar to the first optoelectronic device 100. Specifically, the first portion of the substrate 204a may support a first light source 224a and first light detector 228a. The first light source 224a may be similar or identical with the light source 124 and the first light detector 228a may be similar or identical to the light detector 128. Wires 232, 236 may be used to establish electrical connections between the components 224a, 228a and the leads 216, 220, respectively.

The second portion of the substrate 204b may be similar or identical to the first portion of the substrate 204a. In particular, the second portion of the substrate 204b may support a second light source 224b and a second light detector 228b. Again, wires 232, 236 may be used to connect the components 224b, 228b to the leads 216, 220.

In some embodiments, the first portion of the substrate 204a supports the optical components that establish a first channel in the optoelectronic device 200 and the second portion of the substrate 204b supports the optical components that establish a second channel in the optoelectronic device 200. The second optoelectronic device 200 may comprise a retaining feature 240 that is similar to retaining feature 140; however, the retaining feature 240 also acts to optically isolate the first channel from the second channel. More specifically, the retaining feature 240 may comprise multiple cavities, one for each channel. Each of the cavities in the retaining feature 240 may by optically isolated from one another by the retaining feature 240 that is made of an opaque and electrically-insulating material. Therefore, light emitted by the first light source 224a is only capable of being detected by the first light detector 228a and light emitted by the second light source 224b is only capable of being detected by the second light detector 228b.

Much like the retaining feature 140, the retaining feature 240 can also act as a physical structure that helps form the optical path for each channel. The retaining feature 240 may also provide the ability to reflect light transmitted by a light source 224a, 224b toward a light detector 228a, 228b. The retaining feature 240 may be premolded into/onto the substrate or it may be manufactured separate from the substrate and then attached thereto. The material(s) used to construct the retaining feature 240 may be the same or different from the material(s) used to construct the substrate.

Although only single and double channel optoelectronic devices 100, 200 are depicted in FIGS. 1 and 2, it should be appreciated that embodiments of the present disclosure are not so limited. In particular, it is contemplated that optoelectronic devices having one, two, three, four, five, six, . . . , twenty, or more channels may be created with retaining features of different sizes and proportions without departing from the scope of the present disclosure.

Furthermore, the retaining features 140, 240 may be continuous or intermittent. For example, the retaining features 140, 240 may be configured to completely surround the optical components of the optoelectronic devices 100, 200 or they may correspond to discrete individual elements that are spaced apart from one another around the optical components (e.g., like fence posts rather than a brick wall).

Referring now to FIGS. 3-7 and 9, a method of manufacturing an optoelectronic device will be described in accordance with embodiments of the present disclosure. It should be appreciated that the method steps described herein may be performed in any order and are not limited to the examples described herein. Moreover, the method described herein can be used to manufacture any type of optoelectronic device described herein, including any intermediate optoelectronic devices in FIGS. 3-7, the first optoelectronic device 100, the second optoelectronic device 200, or other optoelectronic devices (e.g., the third optoelectronic device described in connection with FIG. 8).

Figure 3:
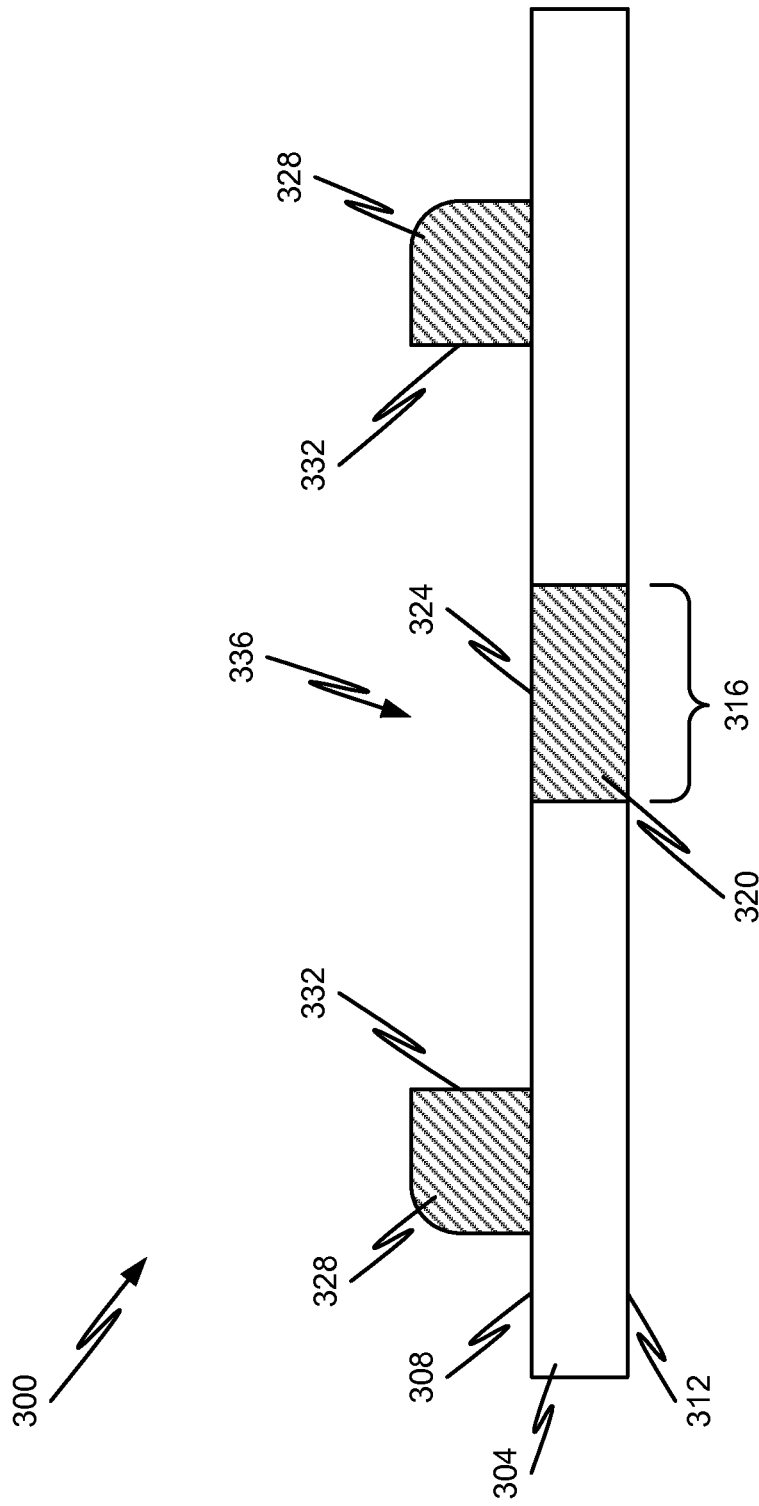
FIG. 3 is a cross-sectional view of a first intermediate optoelectronic device in accordance with embodiments of the present disclosure.

As can be seen in FIG. 3, a first intermediate product 300 may be received having a base layer or substrate 304 with one or more features 320, 328 provided thereon, therein, etc. (step 904). In some embodiments, the one or more features 320, 328 are premolded to the base layer 304. The base layer 304 may correspond to any of the substrates 104, 204a, 204b described above (e.g., a rigid or flexible PCB with traces provided thereon) or the base layer 304 may correspond to a lead or leadframe having one or more leads 116, 120, 216, 220 described above. In either event, the base layer 304 may comprise at least some electrically-conductive components on both an input side and an output side.

The conductive components on the input side may be physically separated from the conductive components on the output side by an isolation gap. As can be seen in FIG. 3, the isolation gap may be filled, partially or completely, with a molded feature 320 that is insulative. The isolation gap may establish a distance 316 between the input side and output side of the base layer. This distance 316 may correspond to a creepage distance that is defined as the shortest path between two conductive parts measured along the surface of the insulation (e.g., along an upper surface 324 of the molded feature 320).

The base layer 304 may comprise a first major surface 308 (e.g., an upper surface) and a second opposing major surface 312 (e.g., a lower surface). The upper surface 324 of the molded feature 320 may be co-planar with the first major surface 308, although such a configuration is not required. Likewise a lower surface of the molded feature 320 may be co-planar with the second major surface 312, although such a configuration is not required.

One or more additional molded features 328 may be provided on the first major surface 308. The one or more additional molded features 328, in some embodiments, correspond to one or more of the retaining features 140, 240. As discussed in connection with the retaining features 140, 240, it should be appreciated that the molded features 328 may be molded directly to the base layer 304 or it may be molded in a separate manufacturing step from the production of the base layer 304 and then attached to the first major surface 308 via a liquid adhesive, adhesive film, adhesive tape, mechanical fittings (e.g., snaps, friction fits, etc.).

The molded feature 328 may comprise a single continuous structure that establishes an optical cavity 336. The optical cavity 336 is configured to receive the optoelectrical components and may also be used for an optical path between optoelectrical devices. In other embodiments, the molded feature 328 may comprise a plurality of discrete pieces that still substantially create the optical cavity 336 but do not continuously surround the optical cavity 336.

Whether the molded feature 328 is continuous or non-continuous, the molded feature 328 may comprise an inner wall 332 that can be used to retain a light-coupling medium with a preferred shape within the optical cavity 336. The inner wall 332 may be untreated and expose the material of the molded feature 328 to the optical cavity 336 or the inner wall 332 may be treated with a reflective coating. For example, the inner wall 332 may be covered with a reflective material (e.g., metallic material, white polymer, etc.). Treatment of the inner wall 332 with a reflective material may help increase the efficiency with which light is transferred from a light source to a light detector and, therefore, can help increase the operational efficiency of the optoelectronic device.

In some embodiments, the height of the molded feature 328 can range between about 30 mils and 100 mils. It should be appreciated, however, that other heights can be accommodated without departing from the scope of the present disclosure. The radial thickness (e.g., the distance from the inner wall 332 to the outer wall of the molded feature 328) can vary from anywhere between about 0.3 mil to 2 mil.

Furthermore, although the molded feature 328 is depicted as having the inner wall 332 be substantially orthogonal to the first major surface 308, it should be appreciated that other configurations are also within the scope of the present disclosure. For instance, the inner wall 332 may be tilted inwardly toward the cavity 336 or outwardly away from the cavity 336. Any angle of inner wall 332 tilt can be accommodated without departing from the scope of the present disclosure.

Figure 4:
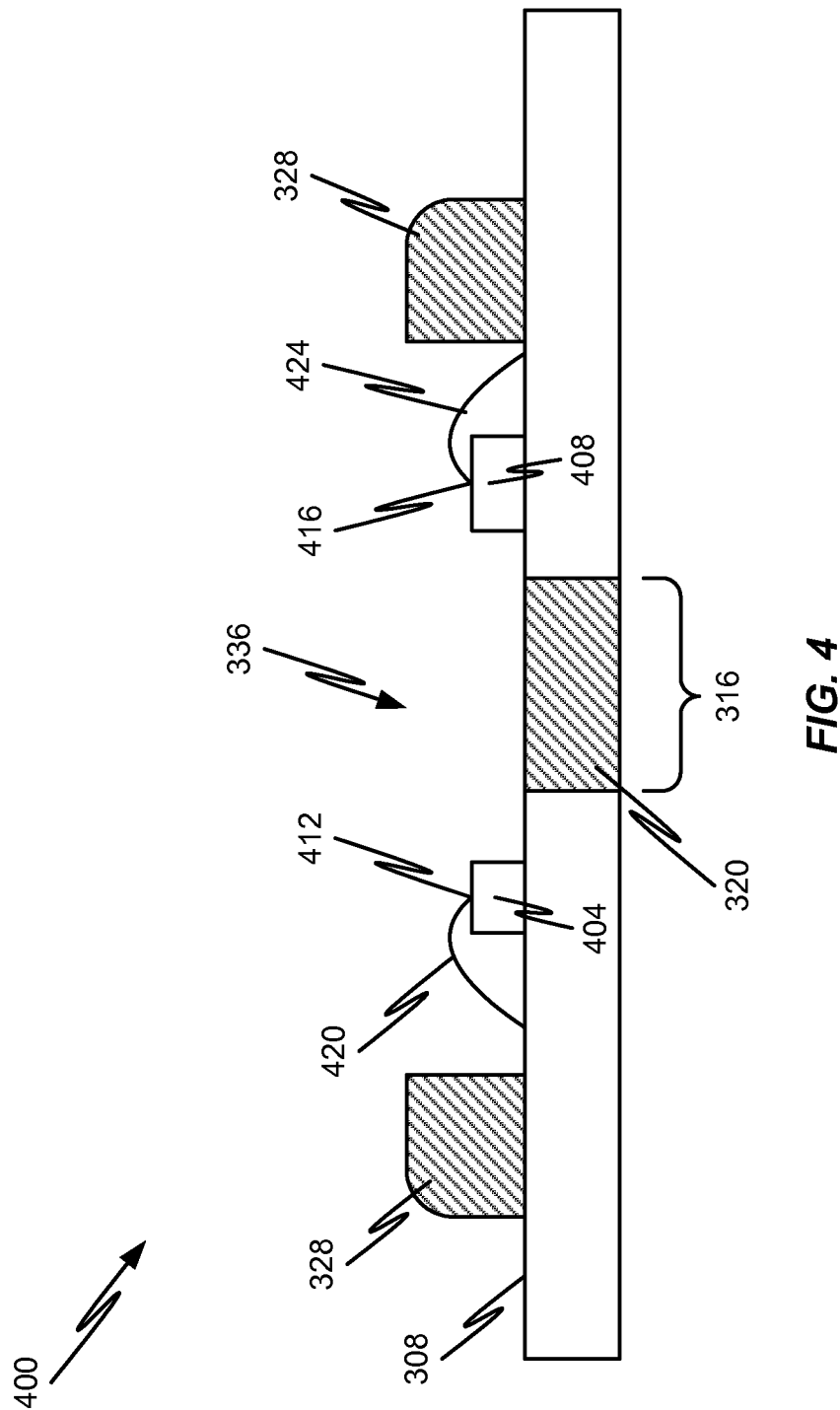
FIG. 4 is a cross-sectional view of a second intermediate optoelectronic device in accordance with embodiments of the present disclosure.

As shown in FIG. 4, upon receiving the premolded base layer 304, a second intermediate product 400 can be achieved by attaching a light source 404 and a light detector 408 on top of (e.g., via an intermediate layer) or directly to the first major surface 308 of the base layer 304 (step 908). Furthermore, the light source 404 and light detector 408 can be attached to electrical contacts (e.g., leads 116, 120, 216, 220) via one or more wires 420, 424 (step 912).

In particular, where the light source 404 and light detector 408 correspond to surface mount devices, the bottom surface of each device can be attached to a bonding pad or lead on the first major surface 308. The bottom surface of each device may also correspond to an anode or cathode of the device thereby also providing an electrical connection between the bond site and the light source 404 or light detector 408. The top surface 412 of the light source 404 may correspond to the other of the anode and cathode of the light source 404 and may be electrically connected to a different electrical lead on the input side 108, 208 via wire 420. Similarly, the top surface 416 of the light detector 408 may correspond to the other of the anode and cathode of the light detector 408 and may be electrically connected to a different electrical lead on the output side 112, 212 via wire 424.

Figure 5:
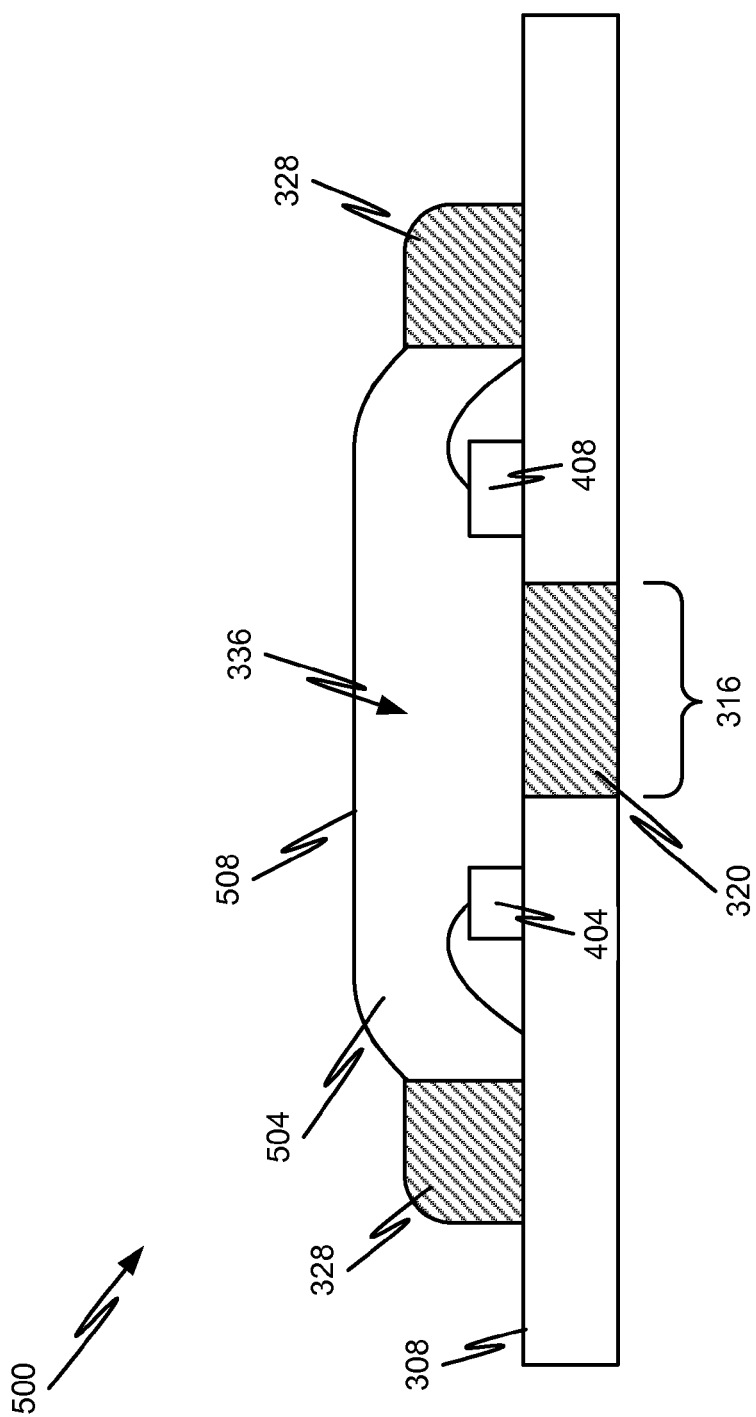
FIG. 5 is a cross-sectional view of a third intermediate optoelectronic device in accordance with embodiments of the present disclosure.
Figure 6:
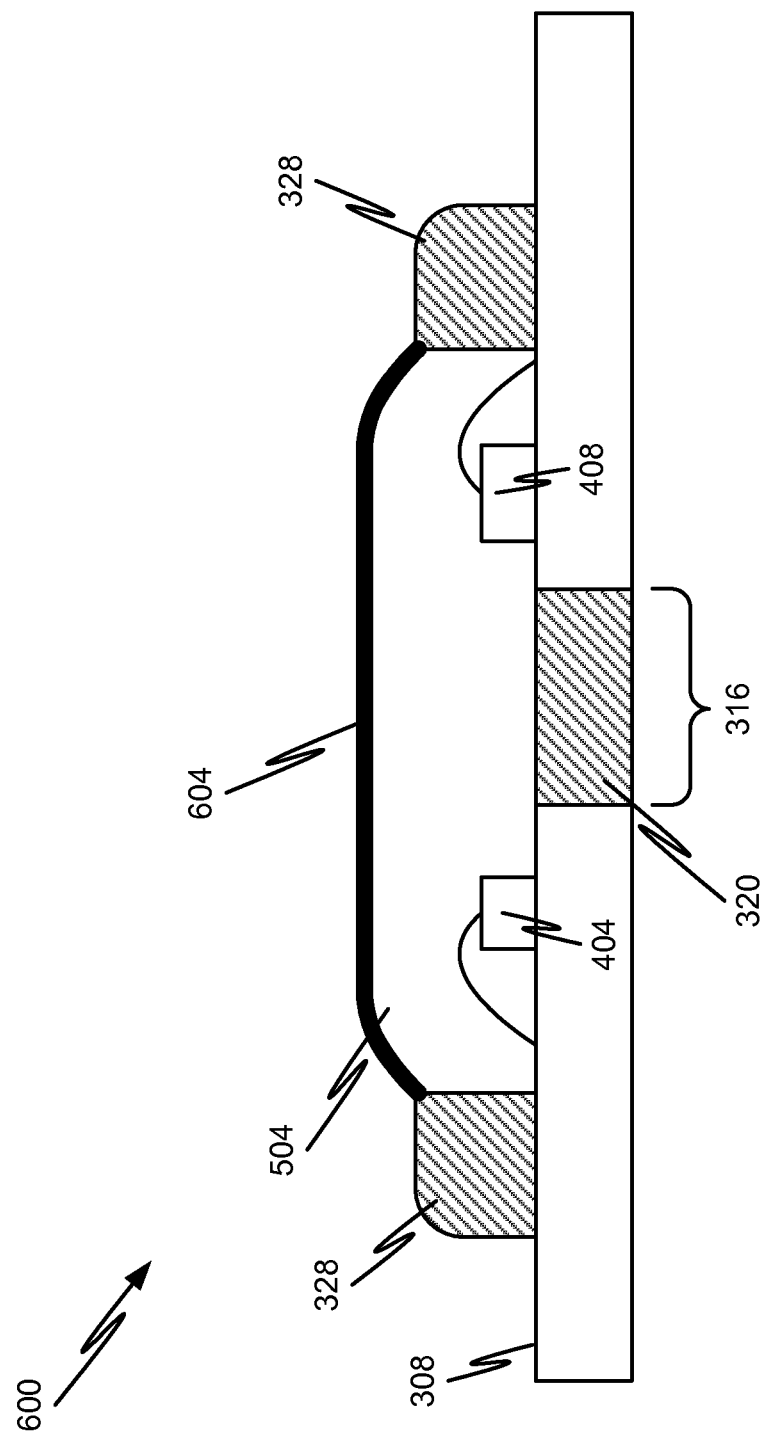
FIG. 6 is a cross-sectional view of a fourth intermediate optoelectronic device in accordance with embodiments of the present disclosure.

As shown in FIG. 5, a third intermediate product 500 is obtained by applying a light-coupling medium 504 within the optical cavity 336 (step 916). The light-coupling medium 504 may correspond to any type of insulating and optically transparent/translucent material. Suitable examples of a light-coupling medium 504 include, without limitation, epoxy, silicone, a hybrid of silicone and epoxy, phosphor, a hybrid of phosphor and silicone, an amorphous polyamide resin or fluorocarbon, glass, plastic, or combinations thereof. Advantageously, the inner walls 332 of the molded feature 328 help retain a desired shape of the light-coupling medium 504. This helps reduce the amount of light-coupling medium used as well as maintain stricter controls over the shape of the optical path between the light source 404 and light detector 408.

The light-coupling medium 504 may be deposited or applied within the cavity 336 using any known deposition process. For example, the light-coupling medium 504 may be deposited in the cavity 336 in a liquid state via use of a dropper, needle, injector, syringe, or any other pressure, gravity, capillary, pinch tube, rotary metering pump, positive-displacement, or wicking-based dispensing system. Once deposited, the light-coupling medium 504 may have an upper surface 508 that is relatively higher than the top of the molded feature 328. Stated another way, the thickness of the light-coupling medium 504 may be greater than the thickness or height of the molded feature 328 as measured from the first major surface 308. The additional height of the light-coupling medium 504 may occur naturally due to the inherent surface tension of the light-coupling medium 504.

As discussed above, it may be desirable to treat the boundaries of the optical cavity 336 with one or more reflective materials or treatments. Accordingly, an optional step may be performed whereby an additional reflective material 604 is applied over the upper surface 508 of the light-coupling medium 504 to obtain a fourth intermediate product 600 (step 920). The additional reflective material 604 does not necessarily have to be an electrical insulator like the light-coupling medium 504, but it can be. Suitable examples of the additional reflective material 604 include, without limitation, a reflective silicone (e.g., TiO2), white polymer, metallic films, reflective tape, etc. The additional reflective material 604 can be applied in a similar fashion to the light-coupling medium 504 (e.g., in a liquid form using dispensing technologies). Alternatively, the additional reflective material 604 may not be liquid and can be applied over the light-coupling medium 504 in any suitable fashion. The additional reflective material 604 can be applied to the light-coupling medium 504 while the light-coupling medium 504 is in either a liquid or solid state.

In some embodiments, the additional reflective material 604 can be provided to further enhance the reflection of light emitted by the light source 404 toward the light detector 408. This enhanced reflection can enable better communications between the light source 404 and light detector 408 and may alleviate the need to utilize more expensive light sources 404 and light detectors 408.

Figure 7:
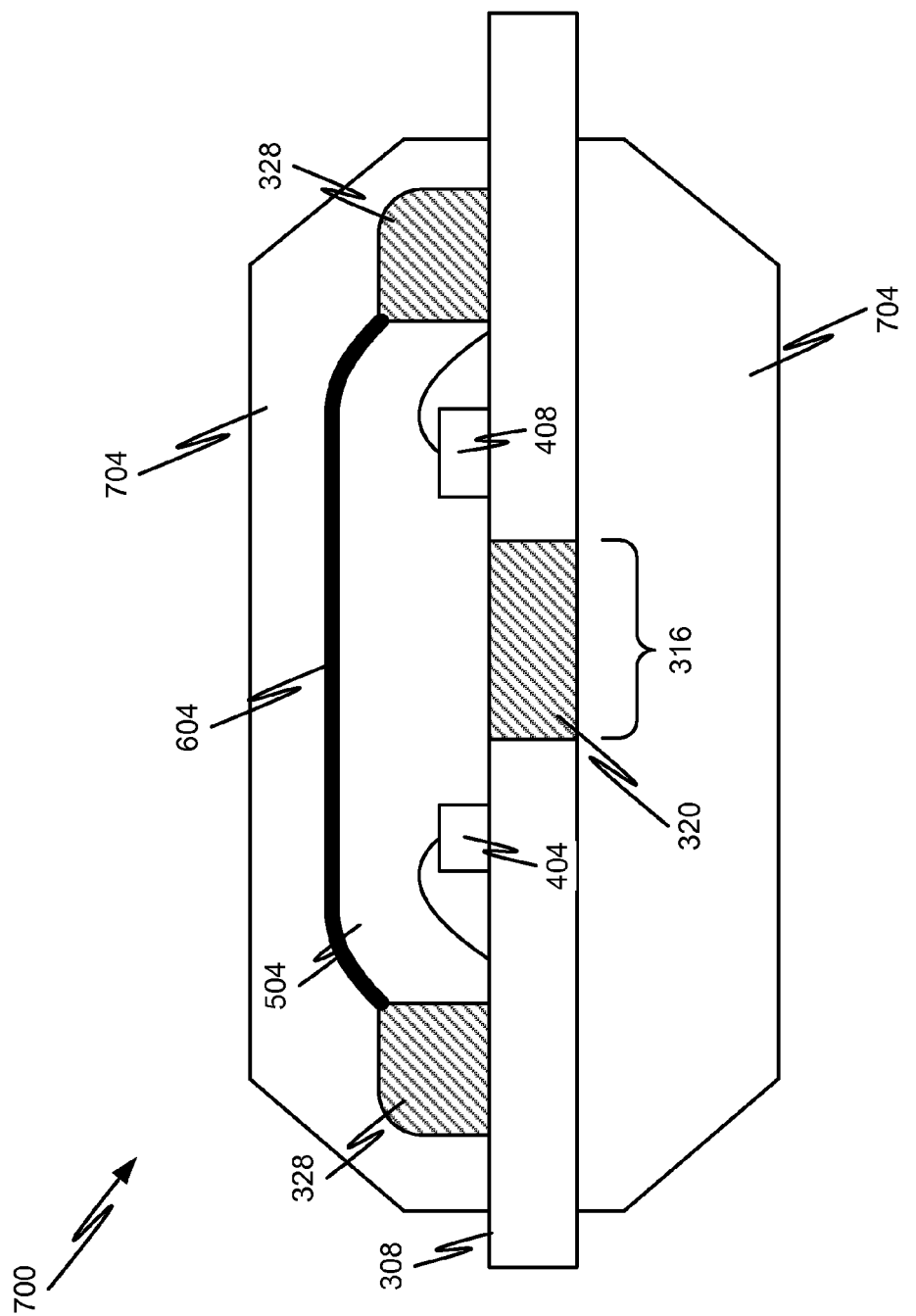
FIG. 7 is a cross-sectional view of an optoelectronic device in accordance with embodiments of the present disclosure.

FIG. 7 shows a fifth intermediate product 700 that can be obtained by applying an overmold 704 around the components of the third or fourth intermediate product 500, 600 (step 924). In some embodiments, the overmold 704 may correspond to an electrically-insulating and opaque material. Specifically, the overmold 704 may substantially optically confine the cavity 336. Example materials that may be used for the overmold 704 include, without limitation, plastics or polymers such as PPA, polyamide, silicone, epoxy, epoxy molding compound, Liquid Crystal Polymer, FR-4, any other insulating material, or combinations thereof.

After the overmold 704 has been applied, the process may continue with singulating each unit from a larger batch (step 928). In particular, it should be appreciated that batch-processing techniques may be employed and multiple optoelectronic devices can be manufactured at substantially the same time. The individual optoelectronic devices can be cut from a larger holder or sheet thereby resulting in the discrete optoelectronic devices.

Figure 8:
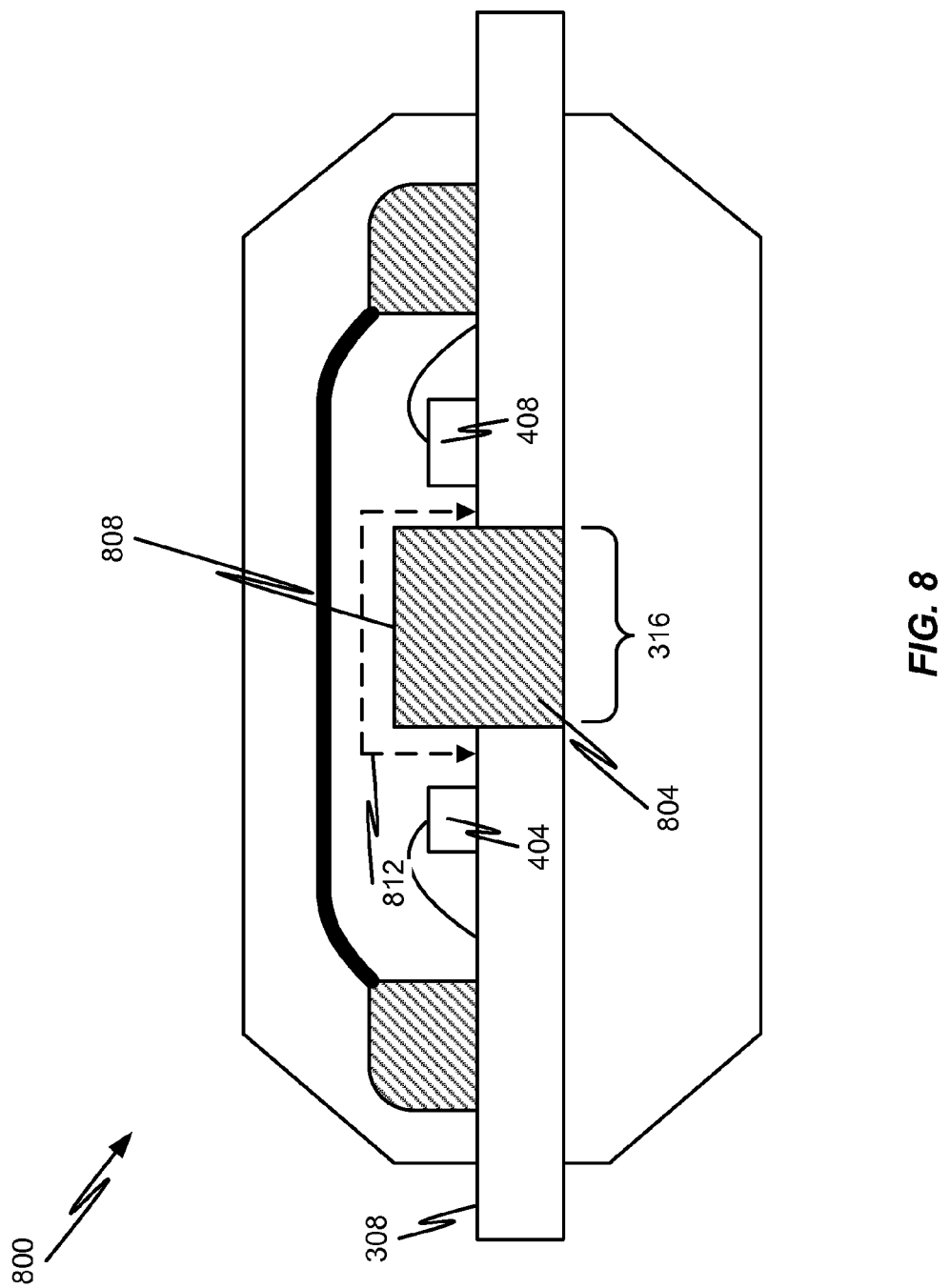
FIG. 8 is a cross-sectional view of an optoelectronic device in accordance with embodiments of the present disclosure.
Figure 9:
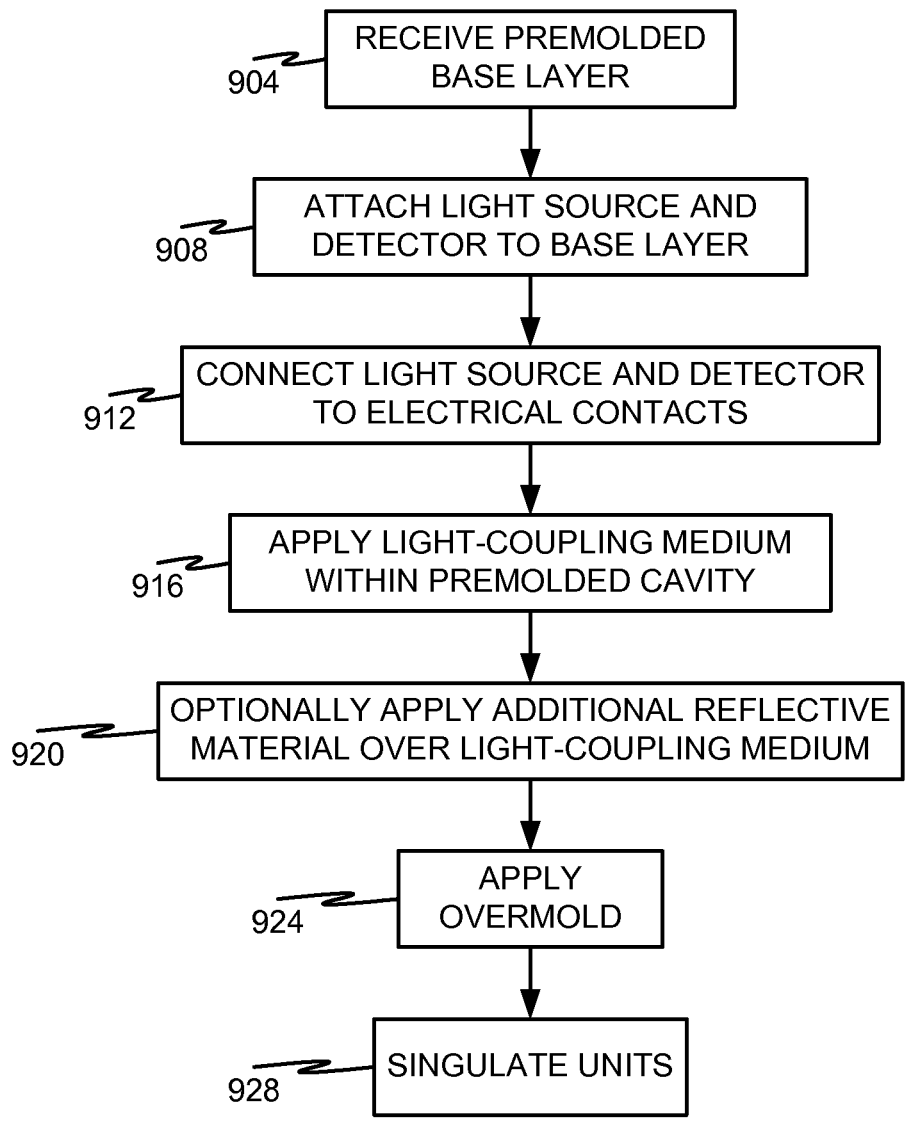
FIG. 9 is a flow chart depicting a method of manufacturing any one of the optoelectronic devices described herein.

With reference now to FIG. 8, another optoelectronic device 800 will be described in accordance with embodiments of the present disclosure. Components of the optoelectronic device 800 may be the same or similar to components of other optoelectronic devices or intermediate devices described herein.

The optoelectronic device 800 may further comprise an extended gap divider 804. The extended gap divider 804 may be made from the same or similar materials as the molded feature 320. The extended gap divider 804, however, may have an upper surface 808 that is not co-planar with the first major surface 308 of the base layer 304. Elevating the upper surface 808 of the extended gap divider 804 helps to create an extended creepage distance 812, thereby enabling the optoelectronic device 800 to operate at higher voltages on the input side.

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. An optoelectronic device, comprising:
a light source configured to emit light according to electrical signals received from one or more input leads;
a light detector configured to detect light emitted by the light source and convert the detected light into electrical signals for transmission by one or more output leads;
a single conductive base layer that supports or includes the one or more input leads and the one or more output leads; and
at least one insulating feature molded on or to the base layer, wherein the at least one insulating feature is configured to at least partially retain a liquefied light-coupling medium and contribute to forming a shape of the liquefied light-coupling medium that establishes an optical path between the light source and light detector.

2. The device of claim 1, wherein the at least one insulating feature comprises one or more of a plastic, polyphthalamide, polyamide, silicone, epoxy, epoxy molding compound, Liquid Crystal Polymer, and FR-4.

3. The device of claim 1, wherein the at least one insulating feature comprises at least one inner wall that at least partially forms an optical cavity in which the light source and light detector are mounted, wherein the at least one inner wall has a first height, and wherein a height of the light-coupling medium is greater than the first height of the at least one inner wall due to an inherent surface tension of the light-coupling medium.

4. The device of claim 3, wherein the at least one inner wall is reflective.

5. The device of claim 3, wherein the at least one inner wall is substantially orthogonal to a first major surface of the base layer.

6. The device of claim 5, wherein the base layer comprises at least one of a substrate and a lead.

7. The device of claim 1, wherein the light-coupling medium is insulative and at least one of transparent and translucent.

8. The device of claim 1, wherein the light-coupling medium comprises at least one of epoxy, silicone, a hybrid of silicone and epoxy, phosphor, a hybrid of phosphor and silicone, an amorphous polyamide resin or fluorocarbon, glass, and plastic.

9. The device of claim 1, wherein the light-coupling medium is covered with an additional reflective material that reflects light from the light source to the light detector.

10. The device of claim 1, further comprising an extended gap divider that is molded in an isolation gap that divides the one or more input leads from the one or more output leads and wherein the extended gap divider comprises an upper surface that is not co-planar with a first major surface of the base layer.

11. An opto-coupler, comprising:
one or more input leads;
one or more output leads;
an isolation gap that electrically separates the one or more input leads from the one or more output leads; and
a molded feature that establishes an optical cavity around the isolation gap, wherein the molded feature is pre-molded on a single base layer, wherein the molded feature is a single continuous piece of insulating material that surrounds the isolation gap and includes at least one inner wall facing the isolation gap, the at least one inner wall being configured to confine a light-coupling medium in a liquid state thereby contributing to a formation of a final shape of the light-coupling medium.

12. The opto-coupler of claim 11, wherein an inherent surface tension of the light-coupling medium contributes to the formation of the final shape of the light-coupling medium when confined by the at one inner wall.

13. The opto-coupler of claim 12, wherein the at least one inner wall comprises a reflective material.

14. The opto-coupler of claim 12, wherein the light-coupling medium comprises silicone.

15. The opto-coupler of claim 11, wherein the molded feature comprises a plurality of discrete pieces of insulating material that surrounds the isolation gap.

16. The opto-coupler of claim 15, wherein the molded feature comprises at least one of a plastic, polyphthalamide, polyamide, silicone, epoxy, epoxy molding compound, Liquid Crystal Polymer, and FR-4.

17. The opto-coupler of claim 11, further comprising a first channel and at least a second channel, the first channel comprising the isolation gap that electrically separates the one or more input leads from the one or more output leads, the at least a second channel comprising a second isolation gap that electrically separates a second set of input leads from a second set of output leads, wherein the molded feature establishes a second optical cavity around the second isolation gap.

18. The device of claim 1, further comprising:
an isolation gap that electrically separates the one or more input leads from the one or more output leads.

19. The device of claim 18, wherein the at least one insulating feature is a single continuous piece of insulating material that surrounds the isolation gap and includes at least one inner wall facing the isolation gap.

20. The device of claim 19, wherein the at least one inner wall is configured to confine a light-coupling medium in a liquid state.

* * * * *